United States Patent
Kim et al.

(10) Patent No.: US 7,473,497 B2
(45) Date of Patent: Jan. 6, 2009

(54) PHASE SHIFTING MASK FOR MANUFACTURING SEMICONDUCTOR DEVICE AND METHOD OF FABRICATING THE SAME

(75) Inventors: In-sung Kim, Seoul (KR); Jung-hyeon Lee, Suwon (KR); Sung-gon Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 741 days.

(21) Appl. No.: 11/084,327

(22) Filed: Mar. 18, 2005

(65) Prior Publication Data
US 2005/0164100 A1  Jul. 28, 2005

Related U.S. Application Data

(62) Division of application No. 10/008,064, filed on Nov. 5, 2001, now Pat. No. 6,893,779.

(30) Foreign Application Priority Data
Mar. 20, 2001  (KR) .................. 2001-14305

(51) Int. Cl.
*G03F 1/00* (2006.01)
(52) U.S. Cl. ......................................................... 430/5
(58) Field of Classification Search .................. 430/5
See application file for complete search history.

(56) References Cited

U.S. PATENT DOCUMENTS

| | | | |
|---|---|---|---|
| 4,720,442 A | 1/1988 | Shinkai et al. ................ 430/5 |
| 5,242,770 A | 9/1993 | Chen et al. ................... 430/5 |
| 5,256,505 A | 10/1993 | Chen et al. ................... 430/5 |
| 5,447,810 A | 9/1995 | Chen et al. ................... 430/5 |
| 5,641,592 A | 6/1997 | Kim ............................. 430/5 |
| 5,663,893 A | 9/1997 | Wampler et al. ............ 364/491 |
| 5,783,337 A | 7/1998 | Tzu et al. ...................... 430/5 |
| 5,789,117 A | 8/1998 | Chen ............................ 430/5 |
| 5,849,438 A | 12/1998 | Bae ............................. 430/5 |
| 5,900,337 A | 5/1999 | Lee ............................. 430/5 |
| 6,015,641 A | 1/2000 | Chou ........................... 430/5 |
| 6,030,729 A * | 2/2000 | Ito et al. ...................... 430/5 |
| 6,458,496 B2 | 10/2002 | Motonaga et al. ........... 430/5 |
| 2001/0035582 A1 * | 11/2001 | Tesauro et al. ............ 257/752 |

FOREIGN PATENT DOCUMENTS

| JP | 2001-222097 | 8/2001 |
|---|---|---|
| KR | 97-48926 | 7/1997 |

* cited by examiner

*Primary Examiner*—Mark F Huff
*Assistant Examiner*—Jonathan Jelsma
(74) *Attorney, Agent, or Firm*—Mills & Onello LLP

(57) ABSTRACT

A phase shifting mask (PSM) for manufacturing a semiconductor device and a method of fabricating the same includes a transparent substrate, a main pattern formed on the transparent substrate and comprising a first phase shifting layer having a first optical transmittance greater than 0, and at least one assistant pattern formed on the transparent substrate proximal to the main pattern for phase-shifting by the same degree as the main pattern and having a second optical transmittance, which is less than the first optical transmittance.

9 Claims, 3 Drawing Sheets

PHASE SHIFTING MASK FOR MANUFACTURING SEMICONDUCTOR DEVICE AND METHOD OF FABRICATING THE SAME

RELATED APPLICATIONS

This application is a divisional of U.S. application Ser. No. 10/008,064, filed on Nov. 5, 2001, now U.S. Pat. No. 6,893,779 which relies for priority upon Korean Patent Application No. 01-14305, filed on Mar. 20, 2001, the contents of which are herein incorporated by reference in their entirety.

BACKGROUND OF THE INVENTION

1. Field of the Invention

The present invention relates to a phase shifting mask (PSM) for manufacturing a semiconductor device and a method of fabricating the same, and more particularly, to a phase shifting mask (PSM) using an assistant pattern and a method of fabricating the same.

2. Description of the Related Art

Resolution enhancement techniques are employed in manufacturing semiconductor devices using optical lithography at around the resolution limit. Such resolution enhancement techniques include off-axis illumination and use of a phase shifting mask (PSM), for example especially a halftone PSM.

The resolution of a specific target pattern can be increased by using a resolution enhancement technique. However, the resolution of a pattern having a different size and distribution from the target pattern is lowered according to a phenomenon referred to in the art as the optical proximity effect. An optical lithography technique for reducing the defects is referred to as optical proximity correction, and various optical proximity correction techniques have been used.

Examples of the defects caused by the optical proximity effect include an increase in bias caused by a decrease in a critical dimension (CD) of an independent pattern and a decrease in depth of focus. When forming a device pattern using optical lithography, the problems can be solved by using a mask for forming a scattering bar or an assistant pattern around the device pattern for reducing the optical proximity effect to cause the device pattern to act as a pattern grouped with the independent pattern without being individually resolved, and by using a mask for forming an assistant pattern around the device pattern. In general, since the assistant pattern must be formed far smaller than the device pattern, it is difficult to manufacture such a mask. It is also difficult to apply the assistant pattern to a small device pattern.

In particular, in the development of a PSM, it becomes important to precisely control the phase formed in the transmitting portion of a mask. However, when forming a small assistant pattern, it is not easy to precisely inspect whether the assistant pattern has formed properly.

SUMMARY OF THE INVENTION

To address the above limitations, it is a first objective of the present invention to provide a phase shifting mask (PSM) capable of being applied to a small device pattern and having an assistant pattern that can be easily inspected to determine whether a pattern has formed properly or not.

It is a second objective of the present invention to provide a method of manufacturing the PSM.

Accordingly, to achieve the first objective, there is provided a phase shifting mask (PSM). The PSM includes a transparent substrate, a main pattern formed on the transparent substrate, comprising a first phase shifting layer having a first optical transmittance greater than 0, and at least one assistant pattern formed on the transparent substrate proximal to the main pattern for phase-shifting by the same degree as the main pattern, the at least one assistant pattern having a second optical transmittance which is less than the first optical transmittance.

In a preferred embodiment, the at least one assistant pattern is not projected onto a wafer during exposure.

It is preferable that the assistant pattern is formed at one side or both sides of the main pattern.

It is also preferable that the assistant pattern is formed of a double layer comprising a second phase shifting layer and a material layer whose optical transmittance is determined by its thickness. Here, the material layer is one of a tungsten (W) layer and a chromium (Cr) layer. The material layer is formed to a thickness such that the optical transmittance of the material layer is 0.

It is also preferable that the second optical transmittance is 0.

It is also preferable that the line width of the assistant pattern is smaller than the line width of the main pattern.

It is also preferable that an anti-reflective layer is interposed between the transparent substrate and the main pattern and between the transparent substrate and the assistant pattern.

To achieve the second objective, there is provided a method of manufacturing a phase shifting mask (PSM). A phase shifting layer having optical transmittance greater than 0 is formed on a transparent substrate. Next, a material layer whose optical transmittance is determined by its thickness is formed on the phase shifting layer. Next, the phase shifting layer and the material layer are patterned to form a first pattern comprising a first phase shifting layer pattern and a first material layer pattern and to form at least one second pattern which is formed proximal to the first pattern comprising a second phase shifting layer pattern and a second material layer pattern. Next, the first material layer pattern is removed from the first pattern to form a main pattern.

It is preferable that the second pattern is formed at one side or both sides of the first pattern.

It is also preferable that the step of forming a main pattern includes the steps of forming a first photosensitive layer pattern exposing the first pattern to the transparent substrate on which the first and second patterns are formed, etching the first material layer pattern by using the first photosensitive layer pattern as a mask, and removing the first photosensitive layer pattern.

It is also preferable that after the step of forming the main pattern, the method further includes the step of reducing the thickness of the second material layer pattern to control the optical transmittance of the second pattern. Here, the step of controlling optical transmittance of the second pattern includes the steps of forming a second photosensitive layer pattern for exposing the second pattern to the transparent substrate on which the main pattern is formed, etching the second material layer pattern by using the second photosensitive layer pattern as a mask to form a thinner second material layer pattern having reduced thickness, and removing the second photosensitive layer pattern.

It is also preferable that the material layer is one of a tungsten (W) layer and a chromium (Cr) layer.

It is also preferable that the line width of the second pattern is smaller than the line width of the first pattern.

It is also preferable that before the step of forming the phase shifting layer on the transparent substrate, the method further includes the step of forming an anti-reflective layer on the transparent substrate.

BRIEF DESCRIPTION OF THE DRAWINGS

The above objectives and advantages of the present invention will become more apparent by describing, in detail, preferred embodiments thereof with reference to the attached drawings in which.

DETAILED DESCRIPTION OF PREFERRED EMBODIMENTS

Figure 1:
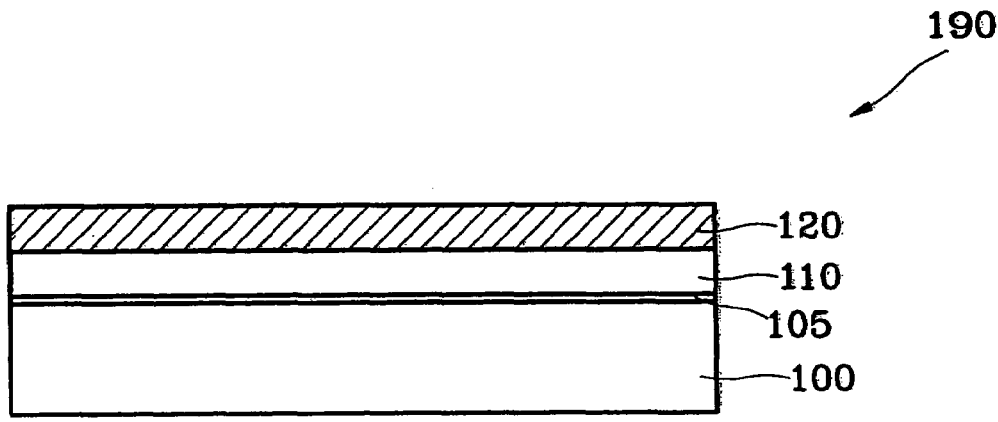
FIGS. 1 through 4 are sectional views illustrating a phase shifting mask (PSM) and fabrication method thereof according to a first embodiment of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. Like reference numerals refer to like elements throughout the drawings. It will be understood that when a layer is referred to as being on another layer or "on" a semiconductor substrate, it may be directly on the other layer or on the transparent substrate, or intervening layers may also be present.

Embodiment 1

FIGS. 1 through 4 are sectional views illustrating a phase shifting mask (PSM) 190 and fabrication method thereof according to a first embodiment of the present invention. Referring to FIG. 1, an anti-reflective layer 105 is formed on a transparent substrate 100. The anti-reflective layer 105 minimizes reflection of an exposure source to the transparent substrate 100 during exposure. A fused silica substrate can be used as the transparent substrate 100. A phase shifting layer 110 having optical transmittance greater than 0 is formed on the anti-reflective layer 105. For example, a molybdenum silicon nitride (MoSiN) layer for shifting the phase of transmitted light by 180° may be formed as the phase shifting layer 110. A material layer 120, the optical transmittance of which is determined by its thickness, is formed on the phase shifting layer 110. Here, the material layer 120 is formed to a thickness such that its optical transmittance is 0. A tungsten (W) layer or a chromium (Cr) layer may be used as the material layer 120.

Figure 2:
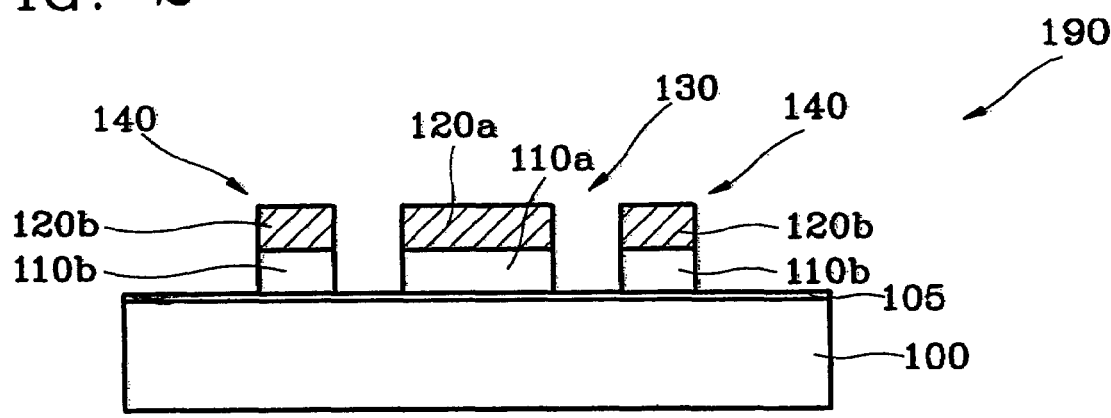

Referring to FIG. 2, the phase shifting layer 110 and the material layer 120 are patterned to form a first pattern 130 including a first phase shifting layer pattern 110a and a first material layer pattern 120a and to form a second pattern 140 including a second phase shifting layer pattern 110b and a second material layer pattern 120b at both sides of the first pattern 130. The line width of the second pattern 140 is formed smaller than the line width of the first pattern 130 so that the second pattern 140 is not projected onto a wafer as a pattern during exposure. The first pattern 130 may have an arbitrary form, and thus the form of the second pattern 140 can be transformed accordingly. Although not shown, a method of forming the first pattern 130 and the second pattern 140 will be described below.

A photosensitive layer is coated onto the resultant of FIG. 1, and then a photosensitive layer pattern for forming the first pattern 130 and the second pattern 140 is formed. By using the photosensitive layer pattern as a mask, the material layer 120 is etched to form the first and second material layer patterns 120a and 120b. Subsequently, the phase shifting layer 110 is etched by using the photosensitive layer pattern and the first and second material layer patterns 120a and 120b as a mask, to form the first and second phase shifting layer patterns 110a and 110b. Next, the photosensitive layer pattern is removed.

Figure 3:
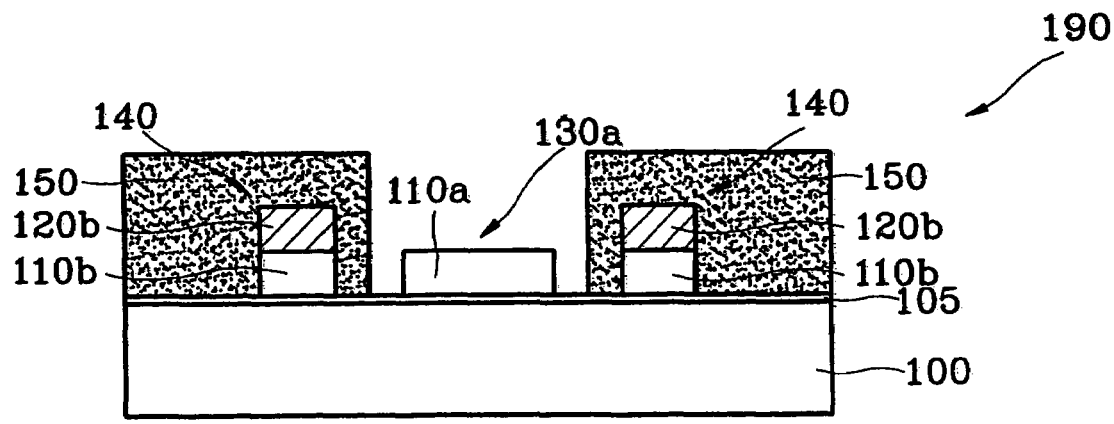

Referring to FIG. 3, a first photosensitive layer pattern 150 exposing the first pattern 130 to the resultant of FIG. 2 is formed. The first material layer pattern 120a of the first pattern 130 is etched by using the first photosensitive layer pattern 150 as a mask. As a result, a main pattern 130a including only the first phase shifting layer pattern 110a is formed.

Figure 4:
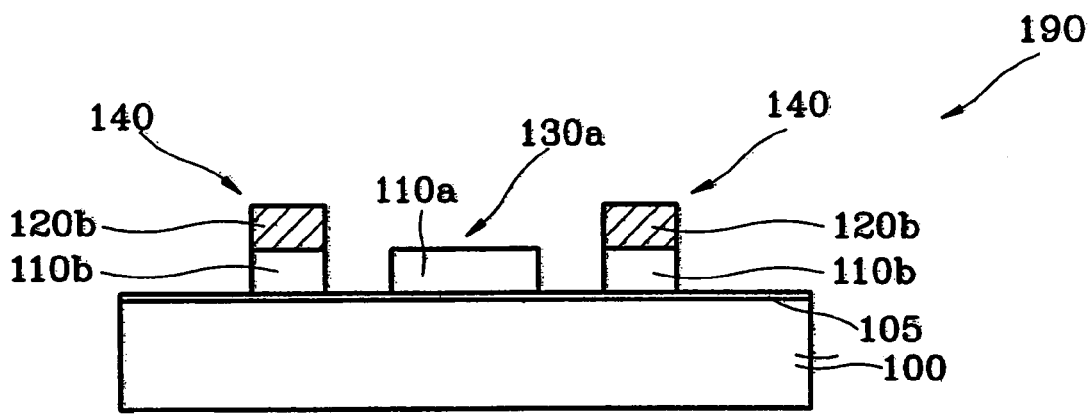

Referring to FIG. 4, the first photosensitive layer pattern 150 is removed. A phase shifting mask (PSM) 190 manufactured by the above method includes a transparent substrate 100 and a main pattern 130a comprising a first phase shifting layer pattern 110a having optical transmittance greater than 0 formed on the transparent substrate 100. A second pattern 140 including a second phase shifting layer pattern 110b and a second material layer pattern 120b is formed on the transparent substrate 100 at both sides of the main pattern 130a. An anti-reflective layer 105 is interposed between the transparent substrate 100 and the main pattern 130a and between the transparent substrate 100 and the second pattern 140, respectively. The second pattern 140 has a line width smaller than that of the main pattern 130a and thus is not projected onto a wafer during exposure. Together the second pattern 140 and the main pattern 130a act as a single pattern, thereby reducing the optical proximity effect. Since the second material layer pattern 120b is formed to a thickness such that its optical transmittance is 0, the optical transmittance of the second pattern 140 is 0, which is smaller than the optical transmittance of the main pattern. 130a. Thus, an assistant pattern can be designed to be greater in line width than the assistant pattern of prior art in which the main pattern and the assistant pattern have the same optical transmittance. As a consequence, the PSM 190 according to the first embodiment can be applied to a small device pattern, and whether the pattern is formed properly or not can be easily determined.

Embodiment 2

Figure 5:
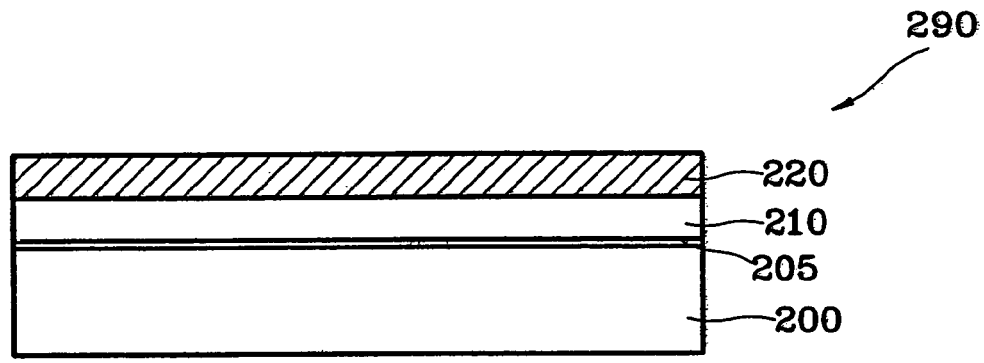
FIGS. 5 through 9 are sectional views illustrating a PSM and fabrication method thereof according to a second embodiment of the present invention.

FIGS. 5 through 9 are sectional views illustrating a PSM 290 and fabrication method thereof according to a second embodiment of the present invention. Referring to FIG. 5, an anti-reflective layer 205 is formed on a transparent substrate 200. A phase shifting layer 210 having optical transmittance greater than 0 is formed on the anti-reflective layer 205. A material layer 220 whose optical transmittance is determined by its thickness is formed on the phase shifting layer 210. The rest of the description is the same as the description for the first embodiment referring to FIG. 1 and will therefore be omitted.

Figure 6:
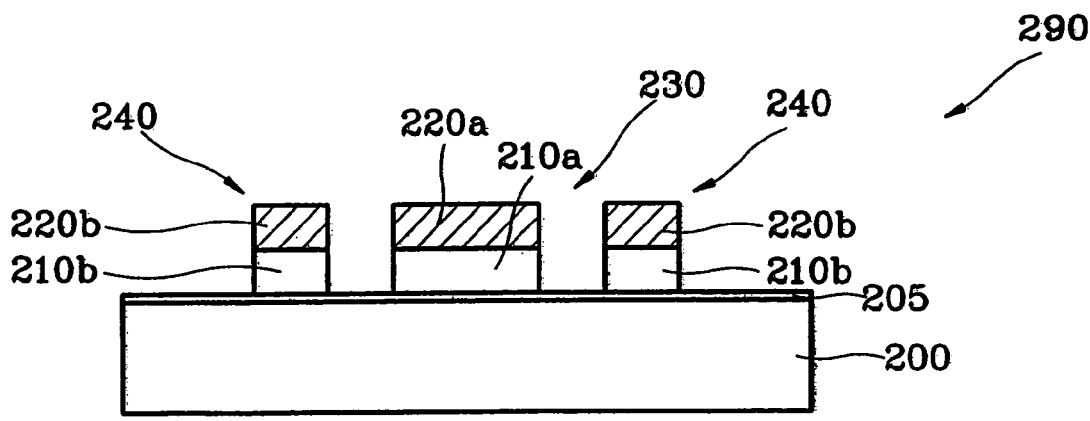

Referring to FIG. 6, the phase shifting layer 210 and the material layer 220 are patterned to form a first pattern 230 including a first phase shifting layer pattern 210a and a first material layer pattern 220a and to form a second pattern 240 including a second phase shifting layer pattern 210b and a second material layer pattern 220b. The rest of the description is the same as the description for the first embodiment referring to FIG. 2 and will be omitted.

Figure 7:
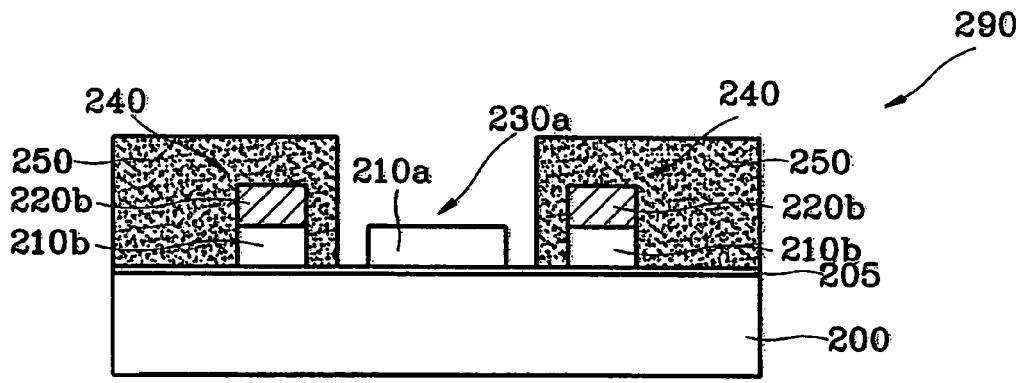

Referring to FIG. 7, a first photosensitive layer pattern 250 exposing the first pattern 230 to the resultant of FIG. 6 is formed. The first material layer pattern 220a of the first pattern 230 is etched by using the first photosensitive layer pattern 250 as a mask. As a result, a main pattern 230a including only the first phase shifting layer pattern 210a is formed.

Figure 8:
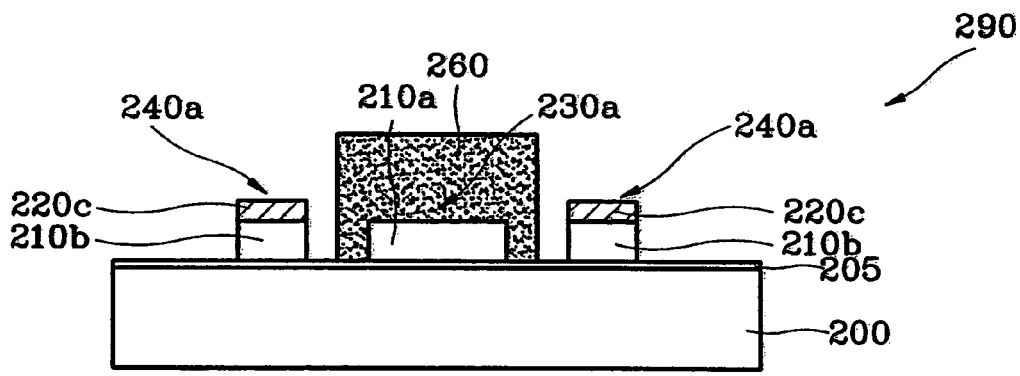

Referring to FIG. 8, the step of reducing the thickness of the second material layer pattern 220b to control optical transmittance of the second pattern 240 is performed as below. First, the first photosensitive layer pattern 250 is removed from the resultant of FIG. 7. Next, a second photosensitive layer pattern 260 exposing the second pattern 240 is formed. The second material layer pattern 220b of the second pattern 240 is etched by using the second photosensitive layer pattern 260 as a mask to form a thinner second material layer pattern 220c. Etching of the second material layer pattern 220b is continuously performed to obtain the target optical transmittance. As a result, the second pattern 240 becomes an assistant pattern 240a whose optical transmittance has increased compared to its optical transmittance before the step of controlling optical transmittance. However, the optical transmittance of the assistant pattern 240a is smaller than that of the main pattern 230a due to the presence of the thinner second material layer pattern 220c.

Figure 9:
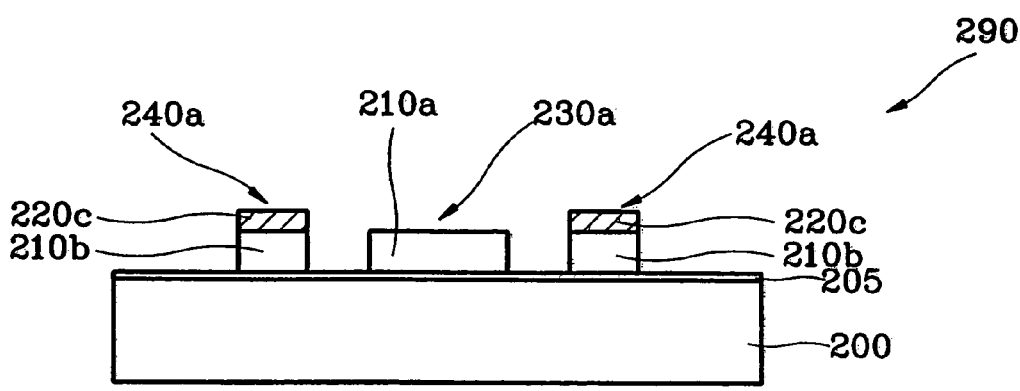

Referring to FIG. 9, the second photosensitive layer pattern 260 is removed. A phase shifting mask (PSM) 290 manufactured by the above method includes a transparent substrate 200 and a main pattern 230a comprising a first phase shifting layer pattern 210a having optical transmittance greater than 0 formed on the transparent substrate 200. An assistant pattern 240a including a second phase shifting layer pattern 210b and a second material layer pattern 220c is formed on the transparent substrate 200 at both sides of the main pattern 230a. An anti-reflective layer 205 is interposed between the transparent substrate 200 and the main pattern 230a and between the transparent substrate 200 and the assistant pattern 240a. The assistant pattern 240a has a line width smaller than that of the main pattern 230a and thus is not projected onto a wafer during exposure. Together the assistant pattern 240a and the main pattern 230a act as a single pattern, thereby reducing the optical proximity effect. The optical transmittance of the assistant pattern 240a is smaller than that of the main pattern 230a. Thus, an assistant pattern 240a can be designed to be greater in line width than the assistant pattern of prior art in which the main pattern and the assistant pattern have the same optical transmittance. As a consequence, the PSM 290 according to the second embodiment can be applied to a small device pattern, and whether the pattern has been formed properly or not can be easily determined.

As described above, an assistant pattern having the same phase as a main pattern and having an optical transmittance smaller than the main pattern, or having optical transmittance of 0 is formed around the main pattern. Together the assistant pattern and the main pattern operate as a single pattern, thereby reducing the optical proximity effect. Thus, the present invention can compensate for an increase in bias caused by a decrease in a critical dimension (CD) of an independent pattern, which is representative of the defects caused by the optical proximity effect, and can prevent a decrease in the depth of focus.

According to the present invention, the assistant pattern having an optical transmittance smaller than the main pattern or having an optical transmittance of 0 is formed, and thus the assistant pattern can be designed to be greater in line width than the assistant pattern of the prior art. Therefore, the present invention can be applied to a small device pattern, and whether the pattern has formed properly or not can be easily determined.

While this invention has been particularly shown and described with reference to preferred embodiments thereof, it will be understood by those skilled in the art that various changes in form and details may be made thereto without departing from the spirit and scope of the invention as defined by the appended claims.

For example, while an assistant pattern is formed at both sides of the main pattern according to the embodiments of the invention illustrated above, the assistant pattern may alternatively be formed on only one side of the main pattern. Further, a plurality of assistant patterns may be formed at one side, or both sides, of the main pattern.

What is claimed is:

1. A method of manufacturing a phase shifting mask (PSM), the method comprising the steps of:

forming a phase shifting layer having optical transmittance greater than 0 on a transparent substrate;

forming a material layer, the optical transmittance of which is determined by its thickness, on the phase shifting layer;

patterning the phase shifting layer and the material layer to form a first pattern comprising a first phase shifting layer pattern and a first material layer pattern and to form at least one second pattern which is formed proximal to, and spaced apart from, the first pattern, the at least one second pattern comprising a second phase shifting layer pattern and a second material layer pattern such that the second phase shifting layer pattern and the second material layer pattern have line widths that are substantially equal, wherein the line width of the at least one second pattern is smaller than the line width of the first pattern; and removing the first material layer pattern from the first pattern to form a main pattern.

2. The method of claim 1, wherein the at least one second pattern is not projected onto a wafer as a pattern during exposure.

3. The method of claim 1, wherein the at least one second pattern is formed at one side or both sides of the first pattern.

4. The method of claim 1, wherein the step of forming a main pattern comprises the steps of:

forming a first photosensitive layer pattern exposing the first pattern to the transparent substrate on which the first and at least one second patterns are formed;

etching the first material layer pattern by using the first photosensitive layer pattern as a mask; and removing the first photosensitive layer pattern.

5. The method of claim 1, further comprising following forming the main pattern, the step of reducing the thickness of the second material layer pattern to control the optical transmittance of the at least one second pattern.

6. The method of claim 5, wherein the step of controlling optical transmittance of the at least one second pattern comprises the steps of:

forming a second photosensitive layer pattern for exposing the at least one second pattern to the transparent substrate on which the main pattern is formed;

etching the second material layer pattern by using the second photosensitive layer pattern as a mask to form a thinner second material layer pattern having reduced thickness; and removing the second photosensitive layer pattern.

7. The method of claim 1, wherein the material layer is one of a tungsten (W) layer and a chromium (Cr) layer.

8. The method of claim 1, further comprising before the step of forming the phase shifting layer on the transparent substrate, the step of forming an anti-reflective layer on the transparent substrate.

9. The method of claim 1, wherein the first pattern and the at least one second pattern operate as a single pattern, thereby reducing optical proximity effect.

* * * * *